United States Patent

Campbell et al.

[15] 3,679,310

[45] July 25, 1972

[54] METHOD OF PARTIAL SHUTTERING FOR EVEN EXPOSURE OF PHOTOSENSITIVE MATERIAL

[72] Inventors: Douglas Earl Campbell; Richard Allen Harris, both of Greensboro, N.C.

[73] Assignee: Western Electric Company Incorporated, New York, N.Y.

[22] Filed: Dec. 30, 1970

[21] Appl. No.: 102,739

[52] U.S. Cl. ................................355/132, 355/54, 355/121

[51] Int. Cl. ....................................................G03b 27/02

[58] Field of Search....................355/40, 54, 71, 74, 81, 101, 355/121, 124, 132; 95/36 R

[56] References Cited

UNITED STATES PATENTS

| | | | |
|---|---|---|---|
| 2,968,992 | 1/1961 | Billet | 355/40 |
| 3,135,184 | 6/1964 | Siebenberg | 95/36 R |
| 3,277,807 | 10/1966 | Cranskens | 355/121 |

*Primary Examiner*—Samuel S. Matthews
*Assistant Examiner*—Fred L. Braun
*Attorney*—W. M. Kain, R. P. Miller and W. L. Williamson

[57] ABSTRACT

A method of uniformly polymerizing a circuit pattern on a strip of photosensitive material by displacing the strip relative to a radiant energy source while successively engaging each of a series of masks. Each mask is supported by one of a series of carriages mounted for movement about the radiant energy source. The leading end of each mask and underlying strip is shadowed by the frame of the supporting carriage as the strip is displaced towards the radiant energy and the opposite end of the mask and underlying strip are shadowed by the frame of the following carriage as the strip is displaced away from the radiant energy source. To compensate for the uneven exposure resulting from the shadowing, the radiant energy is blocked by a shutter from the center portion of each mask that is never shadowed during the movement of the strip through the radiant energy. The radiant energy is blocked for a period of time sufficient to uniformly polymerize the circuit pattern on the strip of photosensitive material.

10 Claims, 5 Drawing Figures

INVENTORS
D. E. CAMPBELL
R. A. HARRIS

By W. L. Williams
ATTORNEY

METHOD OF PARTIAL SHUTTERING FOR EVEN EXPOSURE OF PHOTOSENSITIVE MATERIAL

RELATED APPLICATIONS

Application Ser. No. 80,365 entitled "Apparatus For Conveying And Exposing A Strip Of Radiant Energy Sensitive Material," filed on Oct. 13, 1970, by Mr. R. A. Harris and assigned to Western Electric Co., Inc., relates to an apparatus for making printed circuit boards which may utilize the method of this invention.

BACKGROUND OF THE INVENTION

1. Field of the Invention

This invention relates to a method of partial shuttering for even exposure of photosensitive material; and, more particularly, to a method of producing optimum polymerization of photosensitive material by exposing a portion of the surface of the photosensitive material to a radiant energy source and thereafter selectively shadowing the exposed surface of the photosensitive material while exposing the remaining surface to the radiant energy source.

2. Description of the Technical Problem

In the process of manufacturing printed circuits, a metallized nonconductive strip is coated with a photosensitive material. Thereafter, a mask having a circuit pattern formed therein is positioned over the coated metallized nonconductive strip. The assembly is moved into the radiant energy of a radiant energy source to polymerize the uncovered portions of the photosensitive material setting the configuration of the circuit pattern. In order to produce a circuit pattern having sharp lines, the polymerization of the exposed photosensitive material must be uniform. More particularly, it is necessary to apply a predetermined intensity of radiant energy to the strip in order to produce an optimum exposure of polymerization of the photosensitive material. If the intensity is too strong, the edges of the image may become feathered or fuzzy due to the scattering of the rays beneath the edge of the mask. If the intensity is too low, the images are not fully formed resulting in poor quality circuits.

As previously mentioned, a mask is positioned over the photosensitive material and the mask and strip are displaced beneath a radiant energy source to expose the strip through the mask to the radiant energy. During the displacement of the mask and strip beneath the radiant energy source, it often happens that a portion of the photosensitive material is shadowed. The shadow can be cast by a portion of carriage supporting the mask and/or the assembly feeder for moving the assembly beneath the radiant energy source. The effect of this shadow causes an uneven intensity upon the surface of the photosensitive material.

Adjusting the radiant energy source to compensate for a shadowed portion of the photosensitive material is not practical. For example, if the intensity is adjusted to assure that the unshadowed portion receives the proper intensity, the shadowed portion will not receive the required amount of intensity to fully form the image. Conversely, should the intensity be adjusted so that the shadowed portion receives the proper intensity, the unshadowed portion will receive too much intensity and the image will become feathered or fuzzy.

SUMMARY OF THE INVENTION

An object of this invention is to provide a method of evenly exposing photosensitive material.

It is further object of the invention to partially shutter light rays from a radiant energy source to uniformly polymerize photosensitive material.

It is a further object of the invention to produce printed circuits by shuttering a portion of the radiant energy of a radiant energy source from a previously exposed surface while exposing the remaining surface to uniformly polymerize the surface of a photosensitive material which are exposed by a mask having circuits formed therein.

With these and other objects in view, the present method contemplates moving a metallized nonconductive strip having a coating of photosensitive material on at least one side into radiant energy to evenly expose the photosensitive photosensitive material on at into radiant energy to evenly expose the photosensitive material. More particularly, the method is practiced by successively moving the strip into engagement with a series of masks, each having a circuit formed therein and supported by one of a series of carriages mounted for displacement relative to a radiant energy source. As the strip moves relative to the radiant energy source, the end of each mask is shadowed by the frame of the supporting carriage, exposing only the unshadowed portion of each mask and underlying strip to the radiant energy. Further movement of the strip actuates a shutter to selectively shield the unshadowed portion of each mask and underlying strip from the radiant energy while exposing the remaining portion of the mask and underlying strip to the radiant energy. Upon still further movement of the strip, the shutter is deactuated permitting the radiant strip to impinge onto the total surface of each mask and underlying strip.

DETAILED DESCRIPTION

Figure 1:
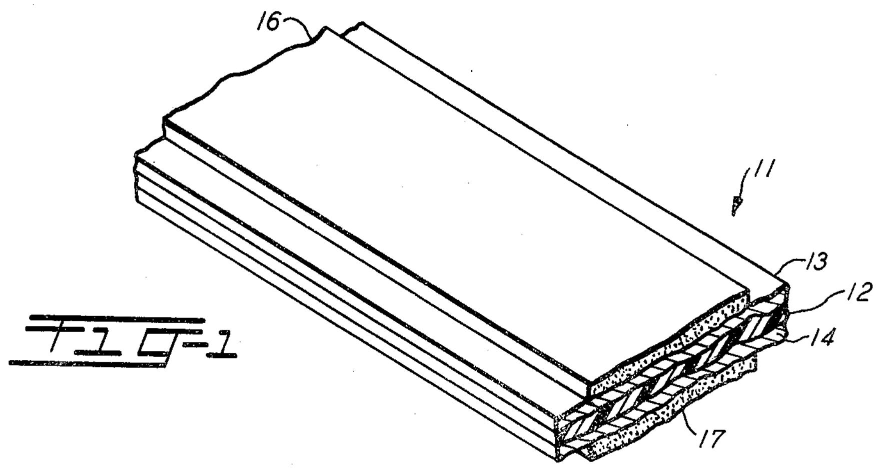
FIG. 1 shows a cut away portion of a metal-clad insulative strip with photosensitive material covering the metal surfaces of the strip.

REferring to FIG. 1, there is shown a section of a strip 11 which is suitable for use in the manufacture of printed circuits. An insulating film 12 such as a flexible epoxy film is covered with a layer of metal 13 on the top thereof and a layer of metal 14 on the bottom thereof to form a laminated structure. The metal layers 13 and 14 may be copper foils which are bonded to the insulating film 12 for use in the manufacture of printed circuits. Many varieties of such metal coated insulated strips are available commercially and may be purchased in rolls. Bonded to the metal layers 13 aNd 14 are layers of a photosensitive material 16 and 17, respectively, which is exposed by radiant energy to form an etch resist. A suitable type of photosensitive material is a photo-polymerizable monomer emulsion. Photo-polymerizable materials are sold commercially, e.g., under the trademark RISTON by Du Pont de Nemours & and Co. of Delaware and under the trademark LAMINAR by Dynachem Corporation of California. The photosensitive material 16 and 17 may completely cover the surface of the metal layers 13 and 14, respectively, or as shown in FIG. 1, cover only a portion of the metal layers 13 and 14.

Figure 2:
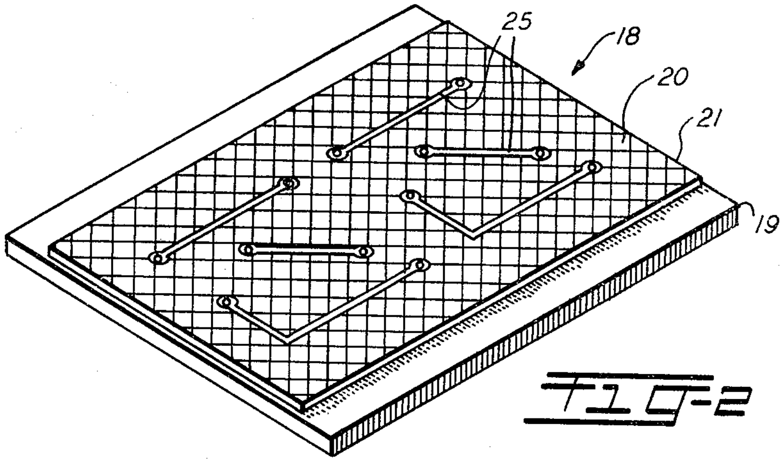
FIG. 2 is a pictorial drawing of a mask having a pattern formed therein.

A pattern is polymerized on the photosensitive material by exposing the photosensitive material through a mask to radiant energy. Any suitable mask may be used such as mask 18 shown in FIG. 2. The mask 18 has a plate 19 which is transparent to radiant energy, such as a glass or plastic. An overlay 21, such as a photographic negative or the like, is placed over the plate 19. If the photosensitive materials 16 and 17 are positive resist, the overlay 21 would have an opaque background 20 with the desired circuit pattern 25 being transparent.

When the photosensitive materials 16 and 17 are exposed through the mask 18, those portions of the photosensitive material which are adjacent to the transparent circuit patterns 25 are exposed to the radiant energy to polymerize the same.

The unpolymerized areas are removed with a suitable solvent such as trichloroethylene and the polymerized areas are used as an etch resist to protect the desired circuit pattern while unwanted portions of the metal layers 13 and 14 are etched away to form a desired circuit pattern.

The path followed by the strip 11 as it is displaced relative to the radiant energy source to polymerize the photosensitive materials 16 and 17 through the mask 18 is not limiting when practicing the method of this invention. The strip 11 having at least one mask overlaying the photosensitive material 16 may be displaced relative to a radiant enerGy source in a horizontal path to polymerize patterns thereon through the masks. Thereafter, the photosensitive material 17 has patterns polymerized thereon in a similar manner. In the alternative, a pair of radiant energy sources may be disposed one on each side of the strip 11. As the strip 11 is displaced in a horizontal path relative to the radiant energy sources, photosensitive materials 16 and 17 have patterns polymerized thereon simultaneously through masks superimposed thereon.

The strip 11 may also be displaced in an arcuate path relative to a radiant energy source. The photosensitive material 16 is sequentially moved into engagement with each of a series of masks supported for movement about the radiant energy source. After the photosensitive material 16 is polymerized through the masks, the strip 11 disengages the masks and the strip 11 is further displaced to move the photosensitive material 17 into engagement with another series of masks mounted for arcuate movement about a second radiant energy source.

Figure 3:
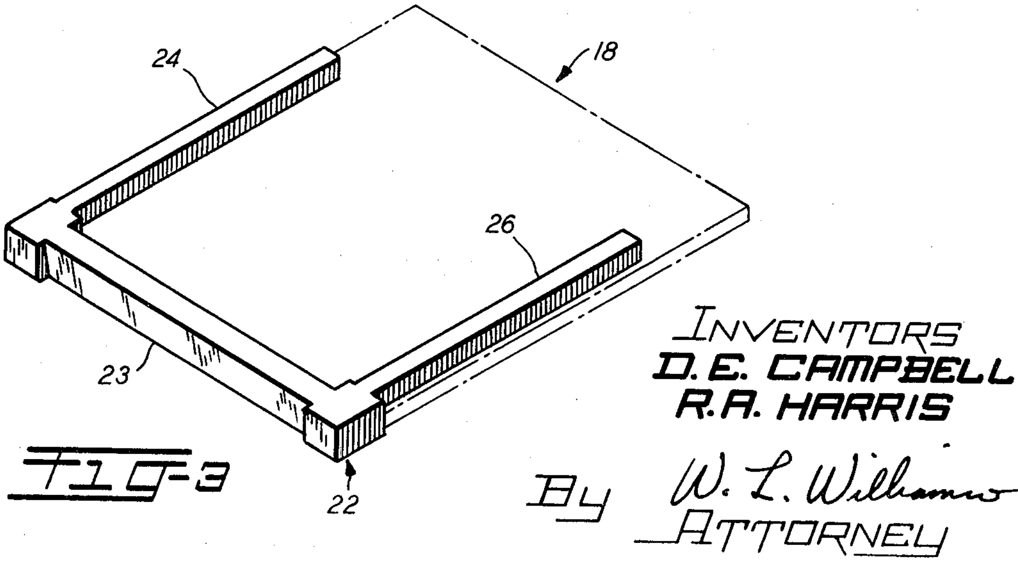
FIG. 3 is a pictorial drawing of one type of carriage that can be used for supporting the mask of FIG. 2.

A suitable apparatus for exposing the photosensitive material 16 and 17 through a mask 18 is disclosed in application Ser. No. 80,365, entitled "Apparatus for Conveying and Exposing a Strip of Radiant Energy Sensitive Material," filed on Oct. 13, 1970 by Mr. R. A. Harris and assigned to Western Electric Co., Inc. In the Harris application, a pair of stationary circular tracks (not shown) each having a series of carriages such as carriage 22 shown in FIG. 3 mounted thereon are displaced along the tracks about a radiant energy source. Each carriage supports a mask, such as mask 18, which masks are successively engaged by a photosensitive material such as photosensitive material 16 and 17 as the strip is displaced relative to the radiant energy source. As shown in FIG. 3, the carriage 22 has a pair of arms 24 and 26 extending from a frame 23 for supporting the masks 18. The frame 23 is of a size to structurally support the arms 24 and 26 against bending as strip 11 engages and moves with the masks supported by the arms 24 and 26 about the radiant energy source. The strip 11 is advantageously provided with a plurality of reference holes (not shown) and the mask 18 with reference pins (not shown) to facilitate accurate alignment of the strip with the mask while the mask and strip are displaced along the tracks.

Figure 4:
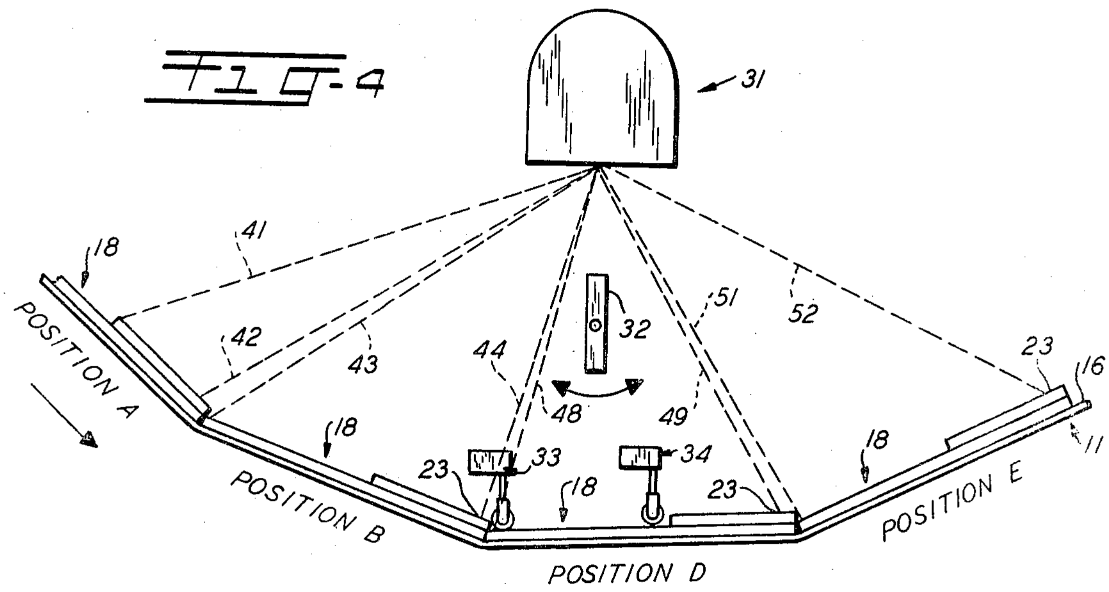
FIG. 4 is a pictorial drawing illustrating the preferred embodiment of the invention at a particular time interval as the strip is displaced relative to a radiant energy source.
Figure 5:
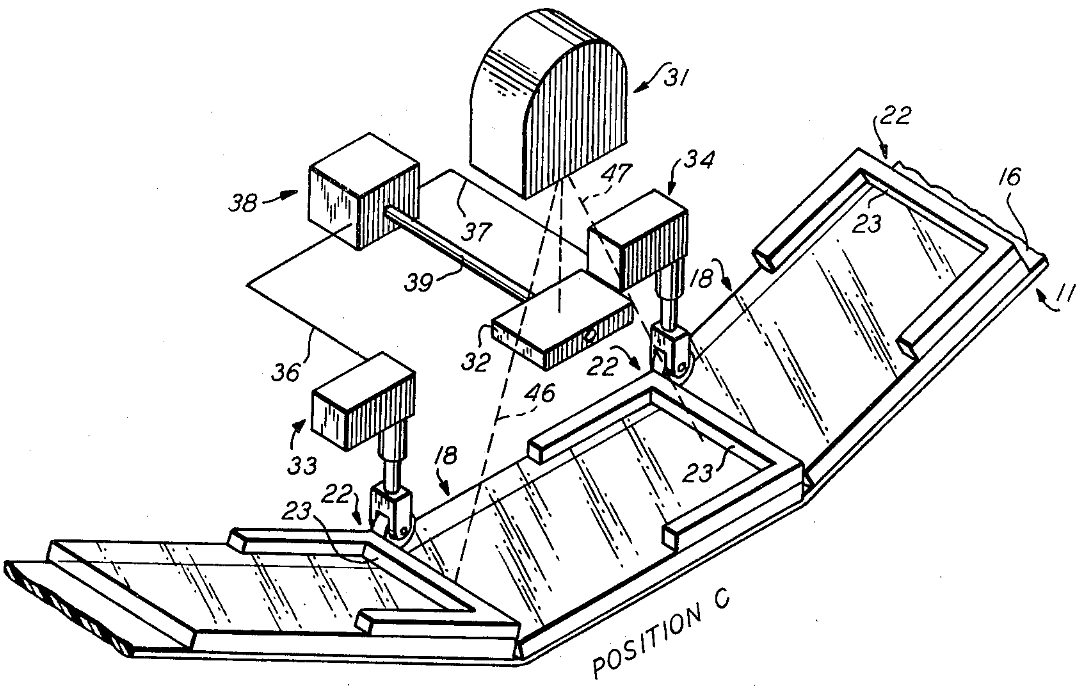
FIG. 5 is a pictorial drawing of the top view of FIG. 4 at a different time interval.

Referring now to FIGS. 4 and 5, there is shown an embodiment of the invention to uniformly polymerize a series of discrete patterns on the strip 11 by modifying the apparatus disclosed in Harris. The strip 11 has a series of masks 18—18 superimposed on the top layer 16 of the photosensitive material. The masks 18—18 are supported by a series of carriages 22—22 (see FIG. 5). The carriages 22—22 are mounted on an arcuate track (not shown) for displacement about the radiant energy source 31. Interposed between the masks 18—18 and the radiant energy source 31 is a pivotally mounted shutter 32. The shutter is made of an opaque material that prevents radiant energy from passing through.

Spaced along the path of the moving strip 11 and the carriages 22—22 are sensing elements 33 and 34 such as microswitches. The sensing elements 33 and 34 are each electrically connected by wires 36 and 37, respectively, to an air driven piston assembly shown generally as 38 to rotate a shaft 39 which is connected to and rotates the shutter 32 (see FIG. 5). When the sensing element 33 is engaged by the frames 23 of the carriages 22—22, the assembly 38 is energized to rotate the shaft which rotates the shutter 32 from a horizontal position to a vertical position and when the sensing element 34 is engaged by the frames 23, the assembly 38 is energized to rotate the shaft which rotates the shutter 32 from the vertical position to the horizontal position.

The top layer 16 of the strip is first exposed to the radiant energy source 31 through the masks 18—18 to polymerize a circuit pattern thereon. After the circuit pattern has been polymerized on the layer 16, the strip 11 disengages the masks 18—18 and is moved into engagement with another series of masks (not shown) similar to that shown in FIG. 2 but having a different circuit pattern to polymerize a corresponding pattern on the bottom layer 17. In this manner, a series of discrete printed circuits can be formed on the strip 11.

Referring again to FIG. 4, the strip as it is displaced to the right relative to the radiant energy source 31 and is in position A, a portion of the mask 18 and underlying strip 11 is shadowed by the frame 23 of the supporting carriage 22 while the remaining portion of the mask and underlying strip is exposed to the radiant energy between rays 41 and 42. As a result, that portion of the mask and underlying strip shadowed by the frame 23 receives less radiant energy than the rest of the mask and the strip. As the strip 11 is further moved relative to the radiant energy 31 and is in position B, the microswitch 33 is engaged by the frame 23 of the carriage 22 in that position and energizes the assembly 38 (FIG. 5) to rotate the shutter 32 from the horizontal position shown in FIG. 5 to the vertical position of FIG. 4. At position B, a smaller portion of the mask 18 and underlying strip 11 is shadowed by frame 23 of the supporting carriage 22 while the remaining portion of the mask 18 and underlying strip 11 is exposed to the radiant energy between rays 43 and 44. As the mask 18 and underlying strip 11 is displaced further to the right as seen in FIGS. 4 and 5, essentially the entire surface of the mask and underlying strip is exposed to the radiant energy until position C shown in FIG. 5 is reached.

In position C, one of the frames 23—23 of the carriage 22—22 engages the microswitch 34 which energizes the assembly 38 to rotate the shutter 32 from the vertical position of FIG. 4 to the horizontal position shown in FIG. 5. The shutter 32 in the horizontal position blocks out the center portion of the radiant energy between rays 46 and 47 exposing the outer portions of the mask and underlying strip. This permits exposure of the shadowed right hand portion of the mask and underlying strip, while blocking out the center portion of the mask and underlying strip so as to compensate for the underexposure of the shadowed right hand portion of the mask. As will be appreciated, as the left hand portion of the mask is exposed at this time, it is subjected to greater amounts of radiant energy than the rest of the mask.

As the strip 11 and carriages 22—22 are further displaced a following portion of the strip 11 and a following carriage 22 moves into position B (see FIG. 4). To engage sensing element 33 by the frame 23 of the following carriage 22 now in position B, this energizes the assembly 38 to rotate the shutter to the vertical position. At this time, the initial or leading portion of the strip 11 and its associated carriage 22 are in position D (FIG. 4) and the entire mask is exposed to radiant energy between rays 48 and 49. As the strip 11 moves out of the radiant energy, the mask 18 is shadowed by the frame 23 of the following carriage 22 and the mask is exposed to the radiant energy between rays 51 and 52, as shown in position E (FIG. 4). In this manner, the greater exposure of the left hand portion of the mask at position C is compensated for and a uniform exposure of the mask and underlying strip is achieved.

In this manner, shadowing of the mask and underlying strip as they are moved into and out of the radiant energy is compensated for by exposing the outer portions of the mask while the center portion is shadowed (see position E, FIG. 5). The positioning of the sensing elements 33 and 34 and the speed of the strip 11 and carriages 22—22 as they are moved through the radiant energy varies dependent on the thickness of the photosensitive material and intensity of the light.

For example, to uniformly polymerize patterns on photosensitive material of the type sold by Du Pont de Nemours & Co. of Delaware under the trademark RISTON having a thickness of 0.0015 inches, a 4,000 watt mercury vapor lamp is advantageously employed as the radiant energy source 31. The photosensitive material is displaced along an arc having a radius of curvature of 2 feet about the radiant energy source which is positioned towards the photosensitive material 1.8 feet away from the center of curvature. The shutter is directly in front of the radiant energy source nine inches from the photosensitive material, and is of a size sufficient to shield one-third of the mask on both sides of a line drawn through the center of the mask and perpendicular to the path of the mask. The shutter has a minimum thickness to prevent blocking out radiant energy when in the vertical position. The time required for the shutter to move from one position to another, i.e., from the vertical position to the horizontal position, is about one-half second. The shutter is in the horizontal position for a period of time equal to two-thirds of the time required for the mask to travel a distance equal to its length when the mask travels at a speed of 1 feet per minute. When the frames 23 is 1 ⅛ inches high, the shutter should block the radiant energy reaching one-third the portion of the mask on both sides of a center line drawn through the mask and perpendicular to the path of the masks.

As will be appreciated, if the frames are spaced sufficiently far apart, the left hand portion of the mask is not shadowed during displacement of the mask. If a continuous strip is used, such wide spacing would not be desirable as large areas of the strip would be unused. But if such a wide spacing is desired or if each mask is associated with a discrete strip, it is only necessary to increase the size of the shutter to also block radiant energy reaching the left hand portion of the mask when the shutter is in the horizontal position.

It is to be understood that the above-described embodiment is simply illustrative of the principles of the invention and that many other embodiments may be devised without departing from the scope and spirit of the invention.

What is claimed is:

1. A method of exposing selected areas of a sheet of photosensitive material to radiant energy from a radiant energy source, comprising the steps of:

displacing the sheet of photosensitive material relative to the radiant energy source, at least one portion of the sheet being shadowed from the radiant energy while the remaining portion is exposed to the radiant energy; and selectively shielding a section of the exposed portion of the sheet during a period of displacement, relative to the radiant energy source to uniformly expose the remAining section of the exposed portion and the unexposed portion of the photosensitive material.

2. A method of exposing areas of a series of discrete articles having a layer of photosensitive material thereon to radiant energy from a radiant energy source, comprising the steps of:

displacing the series of discrete articles relative to the radiant energy source, at least one portion of each article being shadowed from the radiant energy while the remaining portion of each article is exposed to the radiant energy; and shielding that portion of each article which is never shadowed for a sufficient interval of time to uniformly exposed the areas of each article.

3. A method of exposing selected areas of a first side and a second side of an article covered with a photosensitive material, wherein the first side is exposed to radiant energy from a first radiant energy source and the second side is exposed to radiant energy from a second radiant energy source, comprising the steps of:

displacing the article relative to the first and the second radiant energy source, a least one portion of the first side being shadowed from the radiant energy of the first radiant energy source while the remaining portion of the first side is exposed to the radiant energy of the first radiant energy source, and at least one portion of the second side being shadowed from the radiant energy of the second radiant energy source while the remaining portion of the second side is exposed to the radiant energy of the second radiant energy source; and selectively shielding a section of the exposed portion of the first side and of the second side of the article during a period of displacement relative to the first radiant energy source and to the second radiant energy source to uniformly expose the remaining section of the exposed portion and the unexposed portion of the first side and of the second side.

4. The method as set forth in claim 3 wherein the displacing step and the selectively shielding step of the first side are performed at the same rate as the displacing step and the selectively shielding step of the second side.

5. The method as set forth in claim 3 wherein the displacing step and the selectively shielding of the first side are performed before the displacing step and the selectively shielding step of the second side.

6. A method of exposing selected areas of a continuous strip of photosensitive material to radiant energy from a radiant energy source, wherein a carriage supports a plurality of masks for displacement relative to the radiant energy source, comprising the steps of:

displacing the strip relative to the radiant energy source while successively engaging each of said masks so as to sequentially expose the selected areas of the strip to the radiant energy through the masks. The carriage supporting the masks shadowing a portion of the strip when each mask is displaced towards the radiant energy; and shielding that portion of the strip which is never shadowed by the carriage for a sufficient interval of time to uniformly expose the selected areas of the strip.

7. A method of forming a series of discrete patterns on a continuous strip of photosensitive material by exposing the strip to radiant energy from a radiant energy source, wherein a series of carriages each of which supports a patterned mask is mounted for displacement relative to the radiant energy source, comprising the steps of:

displacing the strip relative to the radiant energy source while successively engaging each of the masks to expose the strip to the radiant energy through the mask, each of the carriages shadowing the leading end of the supported mask and a portion of the strip lying thereunder when each carriage is displaced towards the radiant energy; and selectively shielding a section of each mask overlaying the portion of the exposed strip during a period of displacement relative to the radiant energy source while exposing the remaining portion of the strip through the unshielded section of the masks for a sufficient interval of time to form a series of discrete patterns on the strip.

8. A method of exposing selected areas of a continuous strip of photosensitive material to radiant energy from a radiant energy source, wherein a carriage supports a plurality of masks for displacement relative to the radiant energy source, comprising the steps of:

displacing the strip relative to the radiant energy source while successively engaging each of the masks so as to sequentially expose the selected areas of the strip to the radiant energy through the masks, the carriage supporting the masks shadowing a portion of the strip when each mask is displaced towards said radiant energy and when each mask is displaced away from the radiant energy; and shielding that portion of said strip which is never shadowed by the carriage for a sufficient interval of time to uniformly expose the selected areas of the strip.

9. A method of forming a series of discrete pattern images on a continuous strip of photosensitive material by exposing the strip to a radiant energy source, wherein a series of carriages each of which supports a patterned mask is mounted for displacement relative to the radiant energy source, comprising the steps of:

displacing the strip relative to the radiant energy source while successively engaging each of the masks so as to sequentially expose the selected areas of the strip to the radiant energy through the mask, the leading end of the masks is shadowed by supporting carriage when the carriages are displaced towards the radiant energy and the opposite end of the masks is shadowed by the following carriages when the carriages are displaced away from the radiant energy; and blocking the energy source from a central portion of each mask that is never shadowed for a period of time sufficient to uniformly expose the underlying strip through the masks to form the series of discrete pattern images.

10. A method of exposing selected areas of a continuous strip having a first side and a second side covered with photosensitive material, the first side is exposed to radiant energy from a first radiant energy source and the second side is exposed to radiant energy from a second radiant energy source, wherein a first series of carriages each of which supports a first mask is mounted for arcuate movement about the first energy source and a second series of carriages each of which supports a second mask is mounted for arcuate movement about the second energy source, comprising the steps of:

displacing the strip relative to the first radiant energy source while successively engaging each of the first masks supported by the first series of carriages so as to sequentially expose the selected areas of the strip through the first masks to the radiant energy of the first radiant energy source, the leading end of the first masks being shadowed by the supporting carriage when the carriages are displaced towards the radiant energy of the first radiant energy source and the trailing end of the first masks being shadowed by the following carriage of the first series of carriages when the carriages are displaced away from the first radiant energy source;

shielding that portion of the first masks and underlying strip which is never shadowed from the radiant energy of the first radiant energy source for a period of time sufficient to uniformly expose the remaining portion of the selected area of the first side;

succesively disengaging the first side of the strip from the first masks supported by the first series of carriages upon further displacement of the strip relative to the first radiant energy source;

successively engaging each of the second masks supported by the second series of carriagea as the strip is displaced relative to the second radiant energy source to sequentially expose the selected areas of the second side of the strip through the second masks to the radiant energy of the second radiant energy source, the leading ends of the second masks being shadowed by the supporting carriage when the second series of carriages are further displaced relative to the second radiant energy source and the trailing end of the second masks being shadowed by the following carriage of the second series of carriages when the second series of carriages are displaced away from the second radiant energy source; and selectively shielding that portion of the second mask and underlying strip which is never shadowed from the radiant energy of the second radiant energy source for a period of time sufficient to uniformly expose the remaining portion of the selected area of the second side.

* * * * *